(12) United States Patent
Kim et al.

(10) Patent No.: US 11,702,335 B2
(45) Date of Patent: Jul. 18, 2023

(54) LOW STRESS INTEGRATED DEVICE PACKAGE

(71) Applicant: Analog Devices, Inc., Norwood, MA (US)

(72) Inventors: Yeonsung Kim, Bedford, MA (US); Shafi Saiyed, Lynnfield, MA (US); Thomas M. Goida, Windham, NH (US)

(73) Assignee: Analog Devices, Inc., Wilmington, MA (US)

( * ) Notice: Subject to any disclaimer, the term of this patent is extended or adjusted under 35 U.S.C. 154(b) by 72 days.

(21) Appl. No.: 17/112,894

(22) Filed: Dec. 4, 2020

(65) Prior Publication Data
US 2022/0177298 A1 Jun. 9, 2022

(51) Int. Cl.
*B81C 1/00* (2006.01)
*B81B 7/00* (2006.01)

(52) U.S. Cl.
CPC .......... *B81B 7/0048* (2013.01); *B81C 1/0023* (2013.01); *B81B 2207/015* (2013.01)

(58) Field of Classification Search
CPC ..... H01L 23/562; H01L 23/041; H01L 24/85; H01L 23/538; H01L 23/20; H01L 29/84; H01L 23/50; H01L 23/24; H01L 23/49; H01L 2224/48247; H01L 2924/16195; H01L 2224/85002; H01L 2924/19107; H01L 2924/181; H01L 2224/48465; H01L 23/49861; H01L 2224/73265; H01L 23/3121; H01L 2224/48145; H01L 24/48; H01L 2924/00012; H01L 2924/00; G01L 19/147; G01L 19/145; G01L 9/0054; G01L 9/0042; B81B 7/0048; B81B 7/0006; B81B 7/0051; B81B 7/0074; B81B 2201/0242; B81B 2201/0235; B81B 2207/015; G01C 5/06; B81C 1/0023
(Continued)

(56) References Cited

U.S. PATENT DOCUMENTS 8,035,125 B2 10/2011 Abe
8,748,231 B2 6/2014 Logan et al.
(Continued)

FOREIGN PATENT DOCUMENTS

BR 112018071240 B1 * 7/2022
CN 104515638 A 4/2015
(Continued)

OTHER PUBLICATIONS

Machine English Translation of Taylor, BR-112018071240-B1. 2022.*

*Primary Examiner* — Hrayr A Sayadian
(74) *Attorney, Agent, or Firm* — Knobbe, Martens, Olson & Bear, LLP

(57) ABSTRACT

An integrated device package is disclosed. The integrated device package can include a package housing that defines a cavity. The integrated device package can include an integrated device die that is disposed in the cavity. The integrated device die has a first surface includes a sensitive component. A second surface is free from a die attach material. The second surface is opposite the first surface. The integrated device die include a die cap that is bonded to the first surface. The integrated device package can also include a supporting structure that attaches the die cap to the package housing.

20 Claims, 12 Drawing Sheets

(58) Field of Classification Search
USPC .......................................................... 257/415
See application file for complete search history.

(56) References Cited

U.S. PATENT DOCUMENTS

| | | | |
|---|---|---|---|
| 9,352,955 | B2 | 5/2016 | Molfese et al. |
| 9,481,565 | B2 | 11/2016 | Pahl |
| 9,491,539 | B2 | 11/2016 | Vos et al. |
| 9,617,144 | B2 | 4/2017 | Tsai et al. |
| 9,764,946 | B2 | 9/2017 | Chen et al. |
| 10,057,688 | B2 | 8/2018 | Salmon |
| 10,167,189 | B2 * | 1/2019 | Zhang .................... B81B 7/0048 |
| 10,631,100 | B2 | 4/2020 | Chiang et al. |
| 2004/0188782 | A1 | 9/2004 | Fujii |
| 2009/0045498 | A1 | 2/2009 | Braden |
| 2011/0042137 | A1 | 2/2011 | Eskridge |
| 2013/0193530 | A1 | 8/2013 | Ehrenpfordt |
| 2014/0027867 | A1 * | 1/2014 | Goida ................ H01L 23/49575 257/676 |
| 2014/0291781 | A1 | 10/2014 | Shaw |
| 2014/0374925 | A1 | 12/2014 | Logan et al. |
| 2015/0090041 | A1 | 4/2015 | Imai |
| 2015/0369681 | A1 | 12/2015 | Imai |
| 2016/0159642 | A1 | 6/2016 | Hooper et al. |
| 2017/0089789 | A1 | 3/2017 | Kanemoto |
| 2017/0197820 | A1 * | 7/2017 | Naruse ................... B81B 7/0074 |
| 2017/0250118 | A1 | 8/2017 | Yotsuya |
| 2017/0283247 | A1 | 10/2017 | Meyer et al. |
| 2017/0320725 | A1 * | 11/2017 | Goida ................... H01L 23/562 |

FOREIGN PATENT DOCUMENTS

| | | |
|---|---|---|
| CN | 105277172 A | 1/2016 |
| CN | 208200366 U | 12/2018 |
| CN | 107512698 B | 6/2019 |

* cited by examiner

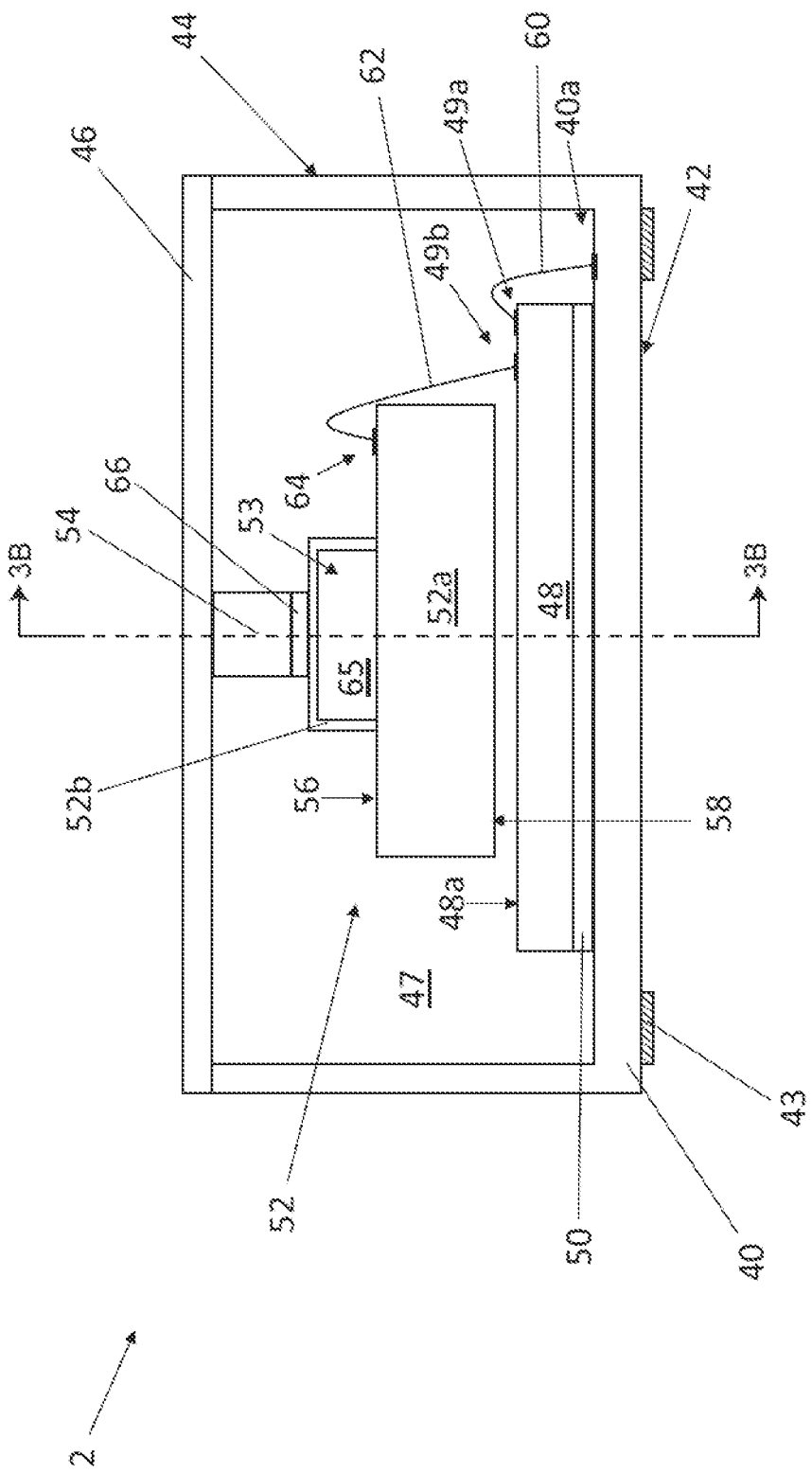

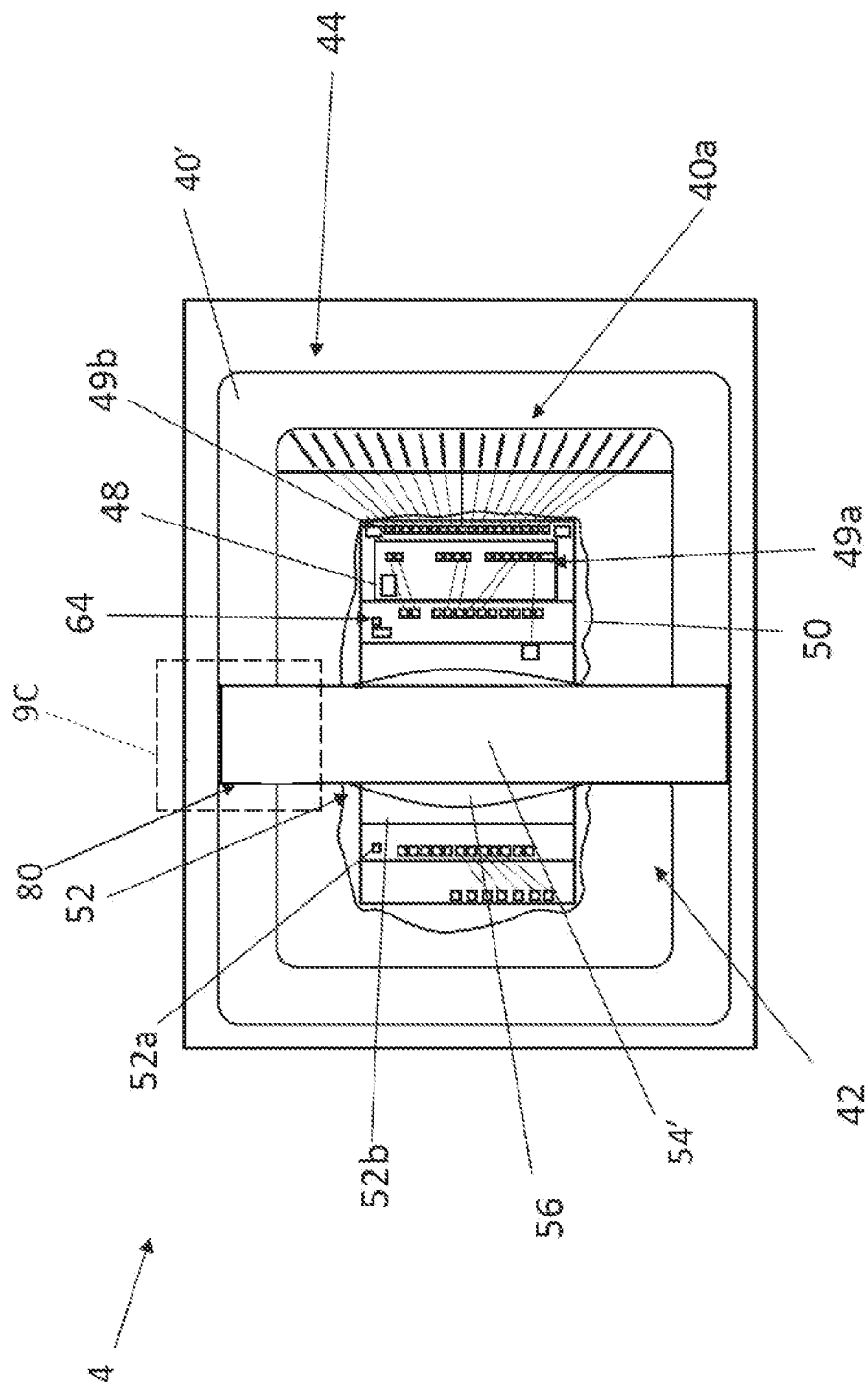

LOW STRESS INTEGRATED DEVICE PACKAGE

CROSS-REFERENCE TO RELATED APPLICATIONS

This application relates to U.S. patent application Ser. No. 15/496,987, titled "LOW STRESS INTEGRATED DEVICE PACKAGES," filed Apr. 25, 2017, published as US Publication No. 2017/0320725 and issued as U.S. Pat. No. 10,800,651, the entire contents of which are hereby incorporated by reference herein in their entirety and for all purposes.

BACKGROUND

Field

The field relates generally to integrated device packages and, in particular, to low stress integrated device packages.

Description of the Related Art

Microelectromechanical systems (MEMS) devices often include movable components which are sensitive to external forces, disturbances, and/or environmental contaminants. For example, MEMS motion sensor devices (such as gyroscopes, accelerometers, etc.) may include movable beams that are sensitive to such external forces that packaging the MEMS devices for integration into the larger electrical or electronic system can be challenging. Accordingly, there remains a continuing need for improved low stress packaging techniques for integrated device packages such as MEMS packages.

SUMMARY

In one aspect, an integrated device package is disclosed. The integrated device package can include a package housing that defines a cavity, an integrated device die that is disposed in the cavity, a carrier that is disposed in the cavity and electrically connected to the package housing, and a support structure that is attached to the die cap. The integrated device die has a first surface that includes a sensitive component and a second surface opposite the first surface. The integrated device die includes a die cap that is bonded to the first surface over the sensitive component. The carrier that is mounted to a portion of the package housing. The support structure mechanically couples the die cap and the package housing.

In one embodiment, the integrated device die includes a microelectromechanical systems (MEMS) die, and the carrier is an application specific integrated device (ASIC) die.

In one embodiment, the package housing includes a base, a sidewall extending from the base, and a lid attached to the sidewall.

In one embodiment, the support structure is bonded to the sidewall or the lid. The carrier can include a second integrated device die that is mounted to the base. The integrated device die can be positioned between the second integrated device die and the lid. The integrated device package can further include a bonding wire electrically connecting and extending between the first surface of the integrated device die and the package housing or the second integrated device die.

In one embodiment, the support structure partially covers an upper surface of the die cap. The support structure can cover 10% to 75% of the upper surface of the die cap. The support structure can include a silicon bar.

In one embodiment, the cavity is a hermetic cavity filled with gas, and the second surface is free from a die attach material.

In one aspect, an integrated device package is disclosed. The integrated device package can include a package housing that defines a cavity. The package housing has a first region and a second region different from the first region. The integrated device package can also include a first integrated device die that is disposed in the cavity. The first integrated device die has a first surface that faces the first region and a second surface that faces away from the first region. The first surface includes a sensitive component. The first integrated device die includes a die cap bonded to the first surface over the sensitive component. The integrated device package can further include a second integrated device die that is disposed in the cavity and mounted to the second region of the package housing.

In one embodiment, the integrated device package further includes a supporting structure that is disposed between the die cap and the first region of the package housing. The supporting structure can mechanically connect the first integrated device die and the package housing.

In one embodiment, the first surface of the first integrated device die includes a conductive pad configured to connect to a bonding wire, and the second surface is free from a die attach material.

In one embodiment, the package housing includes a base, a sidewall extending from the base, and a lid attached to the sidewall, the lid comprises the first region, and the base includes the second region.

In one embodiment, the package housing includes a base, a sidewall extending from the base, and a lid attached to the sidewall. A first portion of the base can include the first region and a second portion of the base laterally offset from the first portion comprises the second region.

In one aspect, an integrated device package is disclosed. The integrated device package can include an integrated device die that has a first surface that include a sensitive component, and a second surface opposite the first surface. The integrated device die includes a die cap attached to the first surface and protecting the sensitive component. The integrated device package can also include a support beam that is attached to the die cap. The support beam partially covers an upper surface of the die cap. The support beam is configured to couple the integrated device die to a package housing.

In one embodiment, the integrated device die includes a microelectromechanical systems (MEMS) sensor die.

In one embodiment, the first surface of the first integrated device die includes a conductive pad configured to receive a bonding wire, and the second surface is free from a die attach material.

In one embodiment, the support structure covers 10% to 75% of the upper surface of the die cap.

In one embodiment, the support beam includes a silicon bar.

BRIEF DESCRIPTION OF THE DRAWINGS

FIG. 3A is a schematic cross sectional side view of an integrated device package according to an embodiment.

FIG. 9B is a schematic top plan view of the integrated device package of FIG. 9A.

DETAILED DESCRIPTION

Various embodiments disclosed herein relate to low stress integrated device packages. Some integrated devices, such as some microelectromechanical systems (MEMS) devices, have components which are sensitive to external forces, disturbances, contaminants, and/or other environmental factors. For example, MEMS motion sensors (such as gyroscopes, accelerometers, etc.) can include movable mechanical components which may be damaged by other packaging components and/or by other external stresses. By way of example, in some packaging arrangements, attaching a gyroscope die to a carrier (such as a package substrate or another integrated device die) with a conventional die attach material (such as commercially available epoxy and silicone materials) may induce excessive stresses in the gyroscope die that can damage the die and/or degrade or impair its performance. Moreover, contacting the die with a conventional encapsulant or molding compound (such as dispensed or molded epoxy compounds) can also impart stresses that can damage the die and/or degrade or impair the performance of the gyroscope die.

Accordingly, various embodiments disclosed herein provide a package for sensitive device dies which protects the sensitive die from stresses, including stresses induced by external forces, other components of the package or larger electronic device, etc. In some embodiments, the package can include a package housing that includes a base, a sidewall extending non-parallel from the base, and a lid. The sidewall can be coupled to (e.g., by an adhesive) or formed with (e.g., monolithically integrated with) the base. The housing can define a cavity. The integrated device package can also include a carrier that is disposed in the cavity and mounted on the base by way of an adhesive, an integrated device die disposed in the cavity, and a support structure attached to the integrated device die.

Figure 1:
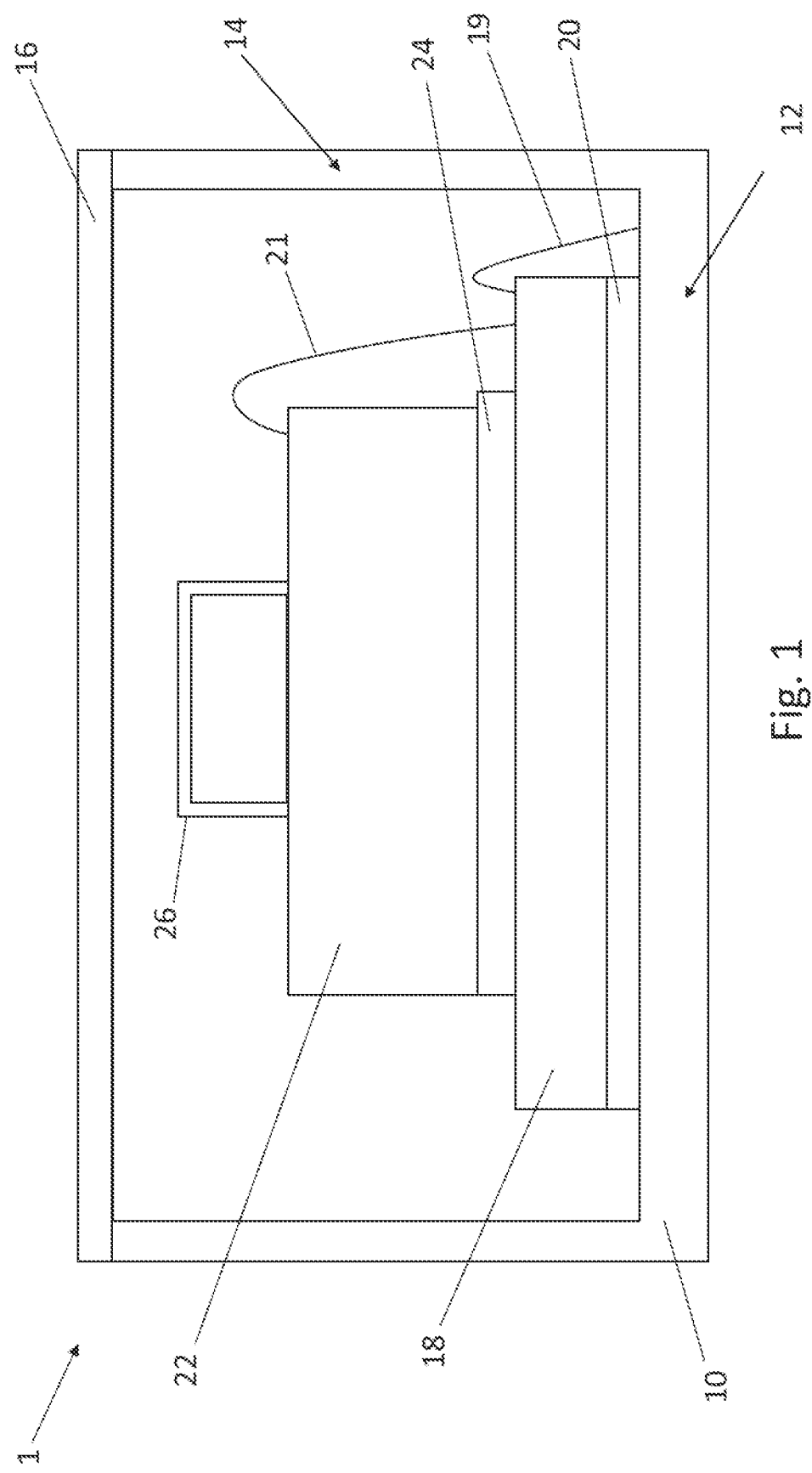
FIG. 1 is a schematic cross sectional side view of a conventional integrated device package.

FIG. 1 is a schematic cross sectional side view of a conventional integrated device package 1. The package 1 includes a package housing 10 that has a base 12, a sidewall 14, and a lid 16 attached to the sidewall 14, an application specific integrated circuit (ASIC) die 18 mounted on the base 12 of the package housing 10 by way of a die attach material 20, a microelectromechanical systems (MEMS) die 22 mounted on the ASIC 18 by way of a die attach material 24, and a die cap 26 attached on the MEMS die 22. The ASIC die 18 can be electrically connected with the package housing 10 by way of a bonding wire 19, and the MEMS die 22 can be electrically connected with the ASIC die 18 by way of a bonding wire 21. In a different arrangement, the ASIC die 18 can be flip chip mounted to the package housing 10. The package housing 10 can include leads or terminals (not illustrated) for connection to an external device or substrate, such as a system board, thereby providing at least a portion of an electrical pathway between the ASIC die 18 and/or the MEMS die and the system board.

In some embodiment, the ASIC die 18 can receive signals transduced by the MEMS die 22 and can pre-process those signals before transmission to the larger electronic system. For example, the ASIC die 18 can comprise active circuitry which converts the analog signals transduced by the MEMS die 22 into digital signals, provides signal conditioning functions, and/or performs various other processes received from (and/or transmitted to) the MEMS die 22.

Though the MEMS die 22 is illustrated as an example, the package 1 can include any suitable type of integrated device die in place of the MEMS die 22. The MEMS die 22 can comprise a motion sensor die, such as a MEMS gyroscope die or a MEMS accelerometer die. The movable components of the motion sensor die may be damaged if a conventional die attach material (such as commercially available epoxy and silicone materials) is used to attach the MEMS die 22 to the ASIC die 18. For example, the use of conventional permanent die attach materials can transmit stresses (e.g., thermally-induced stresses and/or stresses arising from operation or use of the larger device) from the ASIC 18 to the MEMS die 22. Moreover, in packages in which a conventional encapsulant or molding material (not illustrated) is applied over the MEMS die 22, the encapsulant or molding material can impart stresses that can affect the performance of the motion sensor. For example, if the encapsulant contains moisture and/or if the encapsulant is exposed to high temperatures, the encapsulant may expand and press against the MEMS die 22, which may alter the performance of the MEMS die 22 and/or its sensitive components. The die cap 26 can at least partially aid to protect the sensitive components of the MEMS die 22. It should be appreciated that the MEMS die 22 can be other types of sensitive device dies, such as processor dies (e.g., processor dies with sensitive circuitry such as bandgap reference circuitry), memory dies, other types of MEMS dies, etc.

Figure 2:
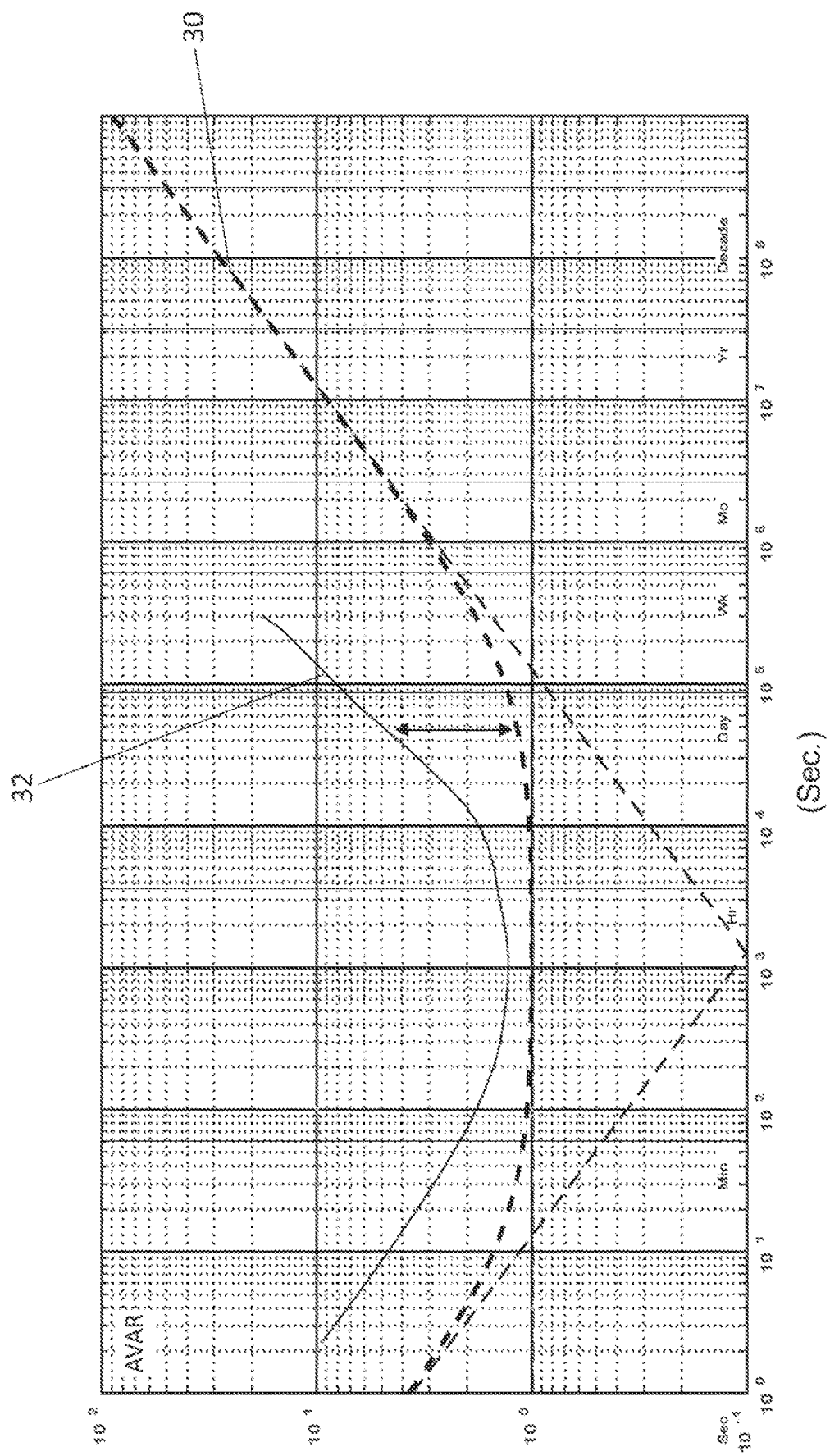
FIG. 2 is a graph showing a performance of a MEMS die of the package of FIG. 1 over time.

FIG. 2 is a graph showing a performance of the MEMS die 22 of the package 1 over time. The x-axis shows time in seconds and the y-axis shows a sensor error in degree per second. A gap between an ideal curve 30 and measurement data 32 can be considered an error that may degrade the performance of the integrated device die 22. From the measurement data 32, it can be observed that the error increases significantly after $10^4$ seconds. The error can be caused by the stresses imparted to the MEMS die 22 as described above. Various embodiments disclosed herein can reduce and/or minimize the error caused by the stresses imparted to a MEMS die.

Figure 3B:
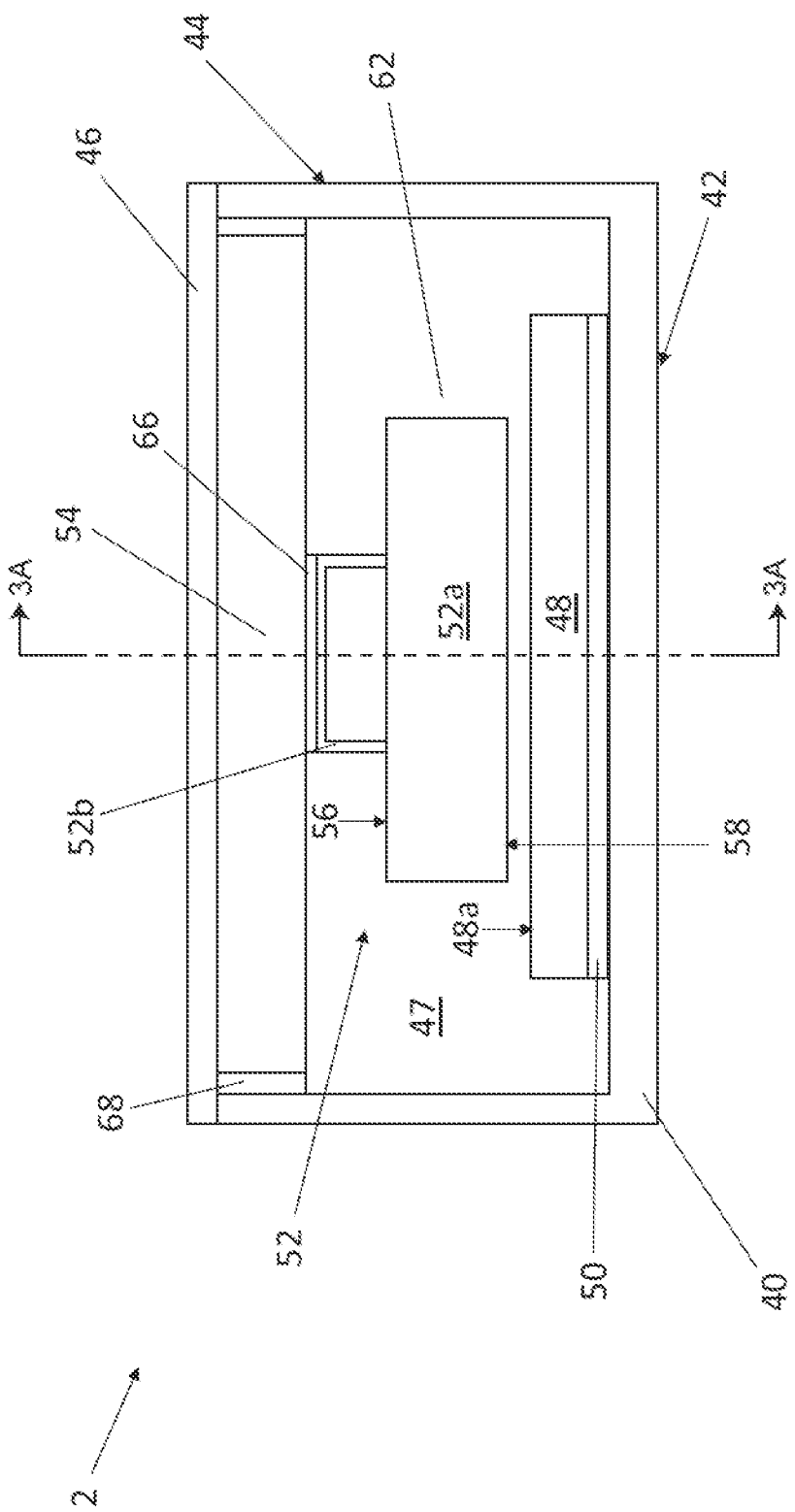
FIG. 3B is another schematic cross sectional side view of the integrated device package of FIG. 3A.

FIG. 3A is a schematic cross sectional side view of an integrated device package 2 according to an embodiment. FIG. 3B is another schematic cross sectional side view of the integrated device package 2 of FIG. 3A. The cross sectional side view of FIG. 3B is taken perpendicular to the cross sectional side view of FIG. 3A. The integrated device package 2 can comprise a package housing 40 that includes a base 42, a sidewall 44 extending non-parallel from the base 42, and a lid 46. The package housing 40 can include terminals 43 on an outer surface of the base 42 to connect to an external device or substrate, such as a system board (not illustrated). The sidewall 44 can be coupled to (e.g., by an adhesive) or formed with (e.g., monolithically integrated with) the base 42. The housing 40 can define a cavity 47. The integrated device package 2 can also comprise a carrier 48 that is disposed in the cavity 47 and mounted on the base 42 by way of an adhesive 50, an integrated device die 52 disposed in the cavity 47, and a support structure 54 attached to the integrated device die 52. The adhesive 50 may comprise a die attach material. The die attach material may comprise an epoxy or a silicone material in various embodiments. In some embodiments, the base 42 of the package housing 40 can comprise a molded leadframe substrate, which includes a conductive leadframe embedded in a molding material or molding compound. In other embodiments, the base 42 can comprise a laminate substrate (e.g., a printed circuit board or PCB), a ceramic substrate, or can comprise a pre-formed or molded housing integrally formed with the sidewall 44.

The carrier 48 can comprise any suitable structural element which is configured to support the integrated device die 52. For example, in some embodiments, the carrier 48 can comprise a semiconductor interposer with embedded conductive traces and/or vias, or a package substrate, such as a printed circuit board (PCB), a molded leadframe, a ceramic substrate, a polymeric substrate, etc. In embodiments in which the carrier 48 comprises a package substrate, the carrier 48 can comprise metallic contact pads and metallic traces for routing electrical signals from the integrated device die 52 to a motherboard of the larger electrical or electronic system. In other embodiments, the carrier 48 can comprise another integrated device die. For example, in some arrangements, the carrier 48 can comprise a processor die (such as an Application Specific Integrated Circuit, or ASIC), and the integrated device die 52 can comprise a MEMS die stacked on the ASIC.

The carrier 48 (e.g., an integrated device die such as an ASIC or other type of processor) can be electrically connected to the package housing 40. For example, as shown in FIG. 3A, a carrier bonding wire 60 may electrically connect a contact pad 49a exposed at an upper surface 48a of the carrier 48 with corresponding leads 40a of the package housing 40. In other embodiments, the carrier 48 can be flip chip mounted to the base 42 of the package housing 40, e.g., a plurality of solder balls can connect contact or bond pads on the lower surface of the carrier 48 with corresponding contacts on the floor of the housing or with the leads. For example, one or more through-substrate vias (TSVs) can extend through the carrier 48 to provide electrical communication between the carrier 48 and the package housing 40, for example, between the contact pad 49a and solder balls on the underside of the carrier 48.

The integrated device die 52 can comprise any suitable type of device die, such as a MEMS die, a processor die, a memory die, etc. In some embodiments, the integrated device die 52 can comprise a motion sensor die, such as a MEMS gyroscope die or a MEMS accelerometer die at a sensitive region 53. In such embodiments, the movable components of the motion sensor die may be damaged if a conventional die attach material (such as commercially available epoxy and silicone materials) is used to attach the integrated device die 52 to the carrier 48. For example, the use of conventional permanent die attach materials can transmit stresses from the carrier 48 to the integrated device die 52 during assembly and/or operation. Moreover, in packages in which a conventional encapsulant or molding material is applied over the integrated device die 52, the encapsulant or molding material can impart stresses that can affect the performance of the motion sensor. For example, if the encapsulant contains moisture and/or if the encapsulant is exposed to high temperatures, the encapsulant may expand and press against the integrated device die 52, which may alter the performance of the integrated device die 52 and/or its sensitive components. It should be appreciated that the integrated device die 52 can include other types of sensitive device dies, such as processor dies (e.g., processor dies with sensitive circuitry such as bandgap reference circuitry), memory dies, other types of MEMS dies, etc.

The integrated device die 52 can comprise a device portion 52a having an upper surface 56 and a lower surface 58, and a die cap 52b that is attached to the upper surface 56 of the device portion 52a over sensitive region 53 in the device portion 52a. For example, the device portion 52a can comprise the movable components of a MEMS motion sensor. The die cap 52b can provide an air cavity over the sensitive components of the device portion 52a. In some embodiments, the die cap 52b can partially cover the upper surface 56 of the device portion 52a so as to cover and protect the sensitive components. In some other embodiments, the die cap 52b can completely cover the upper surface 56 of the device portion 52a. An active, moveable device (such as a movable mechanical beam or element) may be formed or defined in the device portion 52a, e.g., at or near the sensitive region 53 of the device portion 52a. The movable beam or element may comprise a component in a gyroscope or accelerometer device. In such devices, the movable beam or element may be very sensitive. The cap 52b can cover the movable beam or element to provide protection to the movable MEMS element. In some embodiments, a space 55 defined at least partially by the cap 52b and the sensitive region 53 of the device portion 52a can be filled with gas (e.g., air or inert gas).

The carrier 48 and the integrated device die 52 can be electrically coupled through an electrical interconnect (e.g., a bonding wire, conductive ribbon wire, or a conductive tape). For example, a bonding wire 62 can extend from a contact pad 64 (e.g., an aluminum contact pad) on the integrated device die 52 to another contact pad 49b on the carrier 48. In some embodiment, in which the integrated device die 52 comprises a MEMS motion sensor die and the carrier 48 comprises a processor die, the carrier 48 can receive signals transduced by the integrated device die 52 and can pre-process those signals before transmission to the larger electronic system. For example, the carrier 48 (e.g., a processor die) can comprise active circuitry which converts the analog signals transduced by the integrated device die 52 into digital signals, provides signal conditioning functions, and/or performs various other processes received from (and/or transmitted to) the integrated device die 52. In other embodiments, the integrated device die 52 can be electrically connected (e.g., wire bonded) to a conductive land or lead on the package housing 40, which may or may not be the same as the leads 40a to which the carrier 48 connects.

The support structure 54 can comprise any suitable structure for holding or supporting the integrated device die 52. In some embodiments, the support structure 54 can serve as a spacer between a portion of the package housing 40 (e.g., the lid 46) and the integrated device die 52. In some embodiments, the support structure 54 can mechanically couple the integrated device die 52 to the package housing 40. In the embodiment illustrated in FIG. 3A, the support structure 54 can mechanically couple the integrated device die 52 to the lid 46. In some other embodiments, the support structure 54 can couple the integrated device die 52 to the base 42 of the package housing 40 or to the sidewall 44 of the housing 40. The support structure 54 can be connected with the integrated device die 52 in any suitable manner. In some embodiments, the support structure 54 can be connected to the die cap 52*b* of the integrated device die 52 by way of an adhesive 66 (e.g., a die attach material). As shown in FIG. 3A, the die cap 52*b* can be suspended by the support structure 54 below the lid 46. The support structure 54 can be connected with the package housing 40 in any suitable manner. In some embodiments, the support structure 54 can be connected to the sidewall 44 of the package housing 40 by way of an adhesive 68 (e.g., a die attach material). Additionally or alternatively, in some embodiments, the support structure 54 can be connected to the lid 46.

In some embodiments, the support structure 54 allows an active portion (e.g., the device portion 52*a*) of the integrated device die 52 to be spaced apart from the carrier 48 such that the lower surface 58 of the integrated device die 52 is free from a die attach material. In some embodiments, the support structure 54 allows the device portion 52*a* of the integrated device die 52 to be spaced apart from the carrier 48 such that most of or the entirety of the lower surface 58 of the integrated device die 52 is only in contact with the gas (e.g., air) in the cavity 47. As such, the support structure 54 allows the device portion 52*a* of the integrated device die 52 to be spaced apart from the carrier 48 such that the integrated device die 52 experiences less stress from the carrier 48 as compared to a similar package that includes a die attach material between the die and the carrier such as the package 1 illustrated in FIG. 1. Accordingly, the package 2 shown in FIGS. 3A-3B can reduce stresses because the cavity defined by the die cap 52*b* and the material of the support structure 54 and die cap 52*b* provide a low stress die mounting structure.

The support structure 54 can comprise any suitable material. In some embodiments, the support structure 54 can comprise a silicon bar. In some embodiments, the support structure 54 can comprise the same material as the package housing 40, which can reduce or eliminate stresses due to thermal mismatch. The support structure 54 can at least partially cover an upper surface of the die cap 52*b*. In some embodiments, the support structure 54 can have a contact area with the upper surface of the die cap 52*b* so as to provide a sufficient bonding strength for holding the integrated device die 52 during a wire bonding process to connect the bonding wire 62 to the contact pad 64. In some embodiments, the support structure 54 can have a contact area with the upper surface of the die cap 52*b* so as to reduce or minimize stresses imparted to the integrated device die 52 through the contact area. In some embodiments, the support structure 54 covers 1% to 100% of the upper surface of the die cap 52*b*. For example, the support structure 54 can cover 10% to 75% of the upper surface of the die cap 52*b*.

The lid 46 can be separate from the sidewall 44 in some embodiments. The lid 46 can be coupled with the sidewall 44 in any suitable manner. For example, the lid 46 can be bonded to the sidewall 44 by way of an adhesive. In some embodiments, the cavity 47 can be hermetically sealed, when the lid 46 is bonded to the sidewall 44. Therefore, the package housing 40 can protect the components in the cavity 47 from external environs. The cavity 47 can be filled with gas (e.g., air or inert gas).

Figure 4:
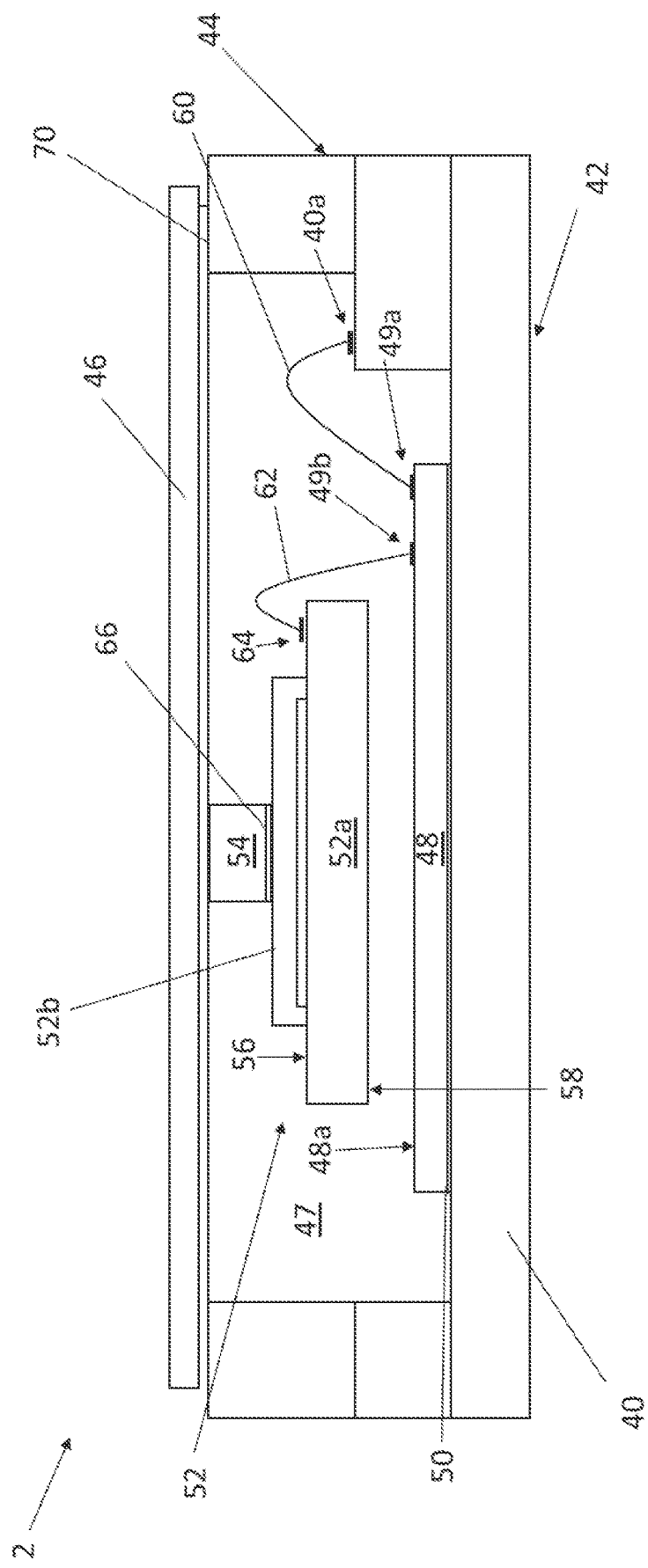
FIG. 4 is a schematic cross sectional side view of an integrated device package according to another embodiment.

FIG. 4 is a schematic cross sectional side view of an integrated device package 2 according to another embodiment. Reference numerals used in conjunction with FIG. 4 may represent the same or generally similar components as those of FIGS. 3A and 3B, unless otherwise noted. The integrated device package 2 can comprise a package housing 40 that includes a base 42, a sidewall 44, and a lid 46. The housing 40 can define a cavity 47. The integrated device package 2 can also comprise a carrier 48 that is disposed in the cavity 47 and mounted on the base 42 by way of an adhesive 50, an integrated device die 52 disposed in the cavity 47, and a support structure 54 attached to the integrated device die 52. The adhesive 50 may comprise a die attach material. The die attach material may comprise an epoxy or a silicone material in various embodiments.

In the embodiment illustrated in FIG. 3A, the package housing 40 can comprise separate portions (the base 42, the sidewall 44, and the lid 46) that are connected together. In some embodiments, the sidewall 44 can comprise a ledge or step that elevates leads 40*a* of the package housing 40. In some embodiments, the lid 46 can be attached to the sidewall 44 by way of an adhesive 70. The adhesive 70 may comprise a die attach material. The die attach material may comprise an epoxy or a silicone material in various embodiments. In some embodiments, the adhesive 70 may also couple the lid 46 and the support structure 54.

Figure 5:
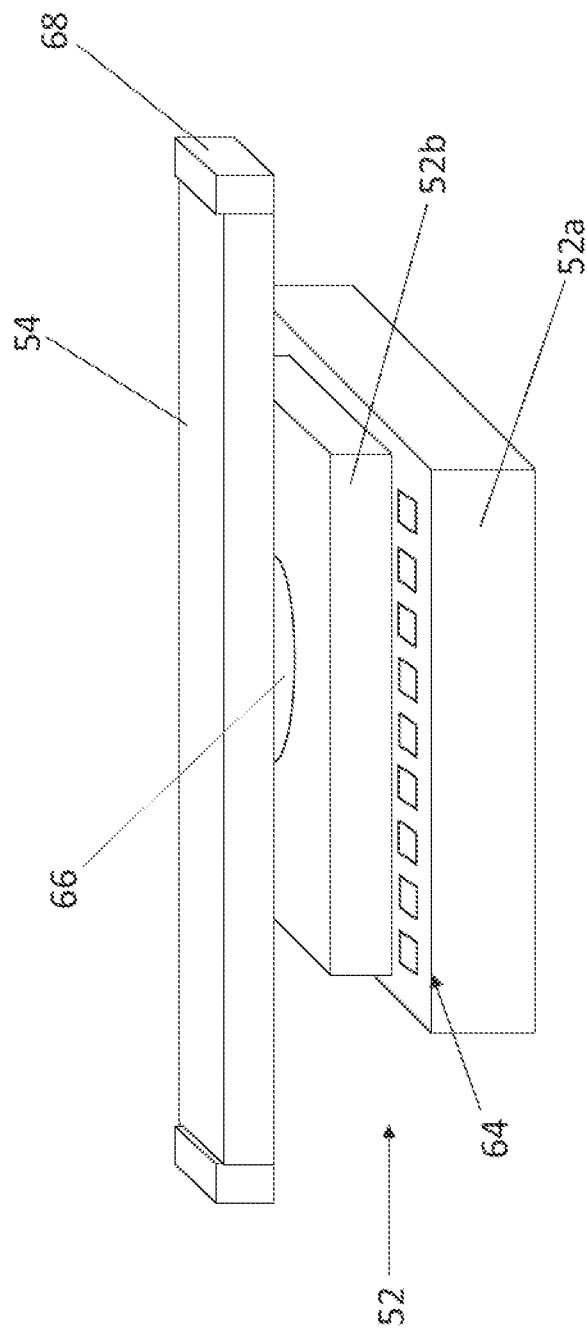
FIG. 5 is a schematic perspective view of a support structure attached to an integrated device die according to an embodiment.

FIG. 5 is a schematic perspective view of a support structure 54 attached to an integrated device die 52 according to various embodiments. The support structure 54 can be implemented in any of the integrated device packages disclosed herein. Reference numerals used in conjunction with FIG. 5 may represent the same or generally similar components as those of FIGS. 3A to 4, unless otherwise noted.

The support structure 54 can comprise any suitable material. In some embodiments, the support structure 54 can comprise an elongate silicon bar. In some embodiments, the support structure 54 can comprise the same material as the package housing 40. The support structure 54 can at least partially cover an upper surface of the die cap 52*b*. In some embodiments, the support structure 54 can have a contact area with the upper surface of the die cap 52*b* so as to provide a sufficient bonding strength for holding the integrated device die 52 during a wire bonding process to connect the bonding wire 62 to the contact pad 64. In some embodiments, the support structure 54 covers 1% to 100% of the upper surface of the die cap 52*b*. For example, the support structure 54 can cover 10% to 75% of the upper surface of the die cap 52*b*.

In some embodiments, the support structure 54 can be connected to the die cap 52*b* of the integrated device die 52 by way of an adhesive 66 (e.g., a die attach material). In some embodiments, the adhesive 66 can comprise an adhesive paste or an adhesive tape. The support structure 54 can be connected with the package housing 40 (see FIGS. 3A-4) in any suitable manner. In some embodiments, the support structure 54 can be connected to the sidewall 44 (see FIGS. 3A-4) of the package housing 40 or to the lid 46 (see FIGS. 3A-4) of the package housing 40 by way of an adhesive 68 (e.g., a die attach material).

Figure 6:
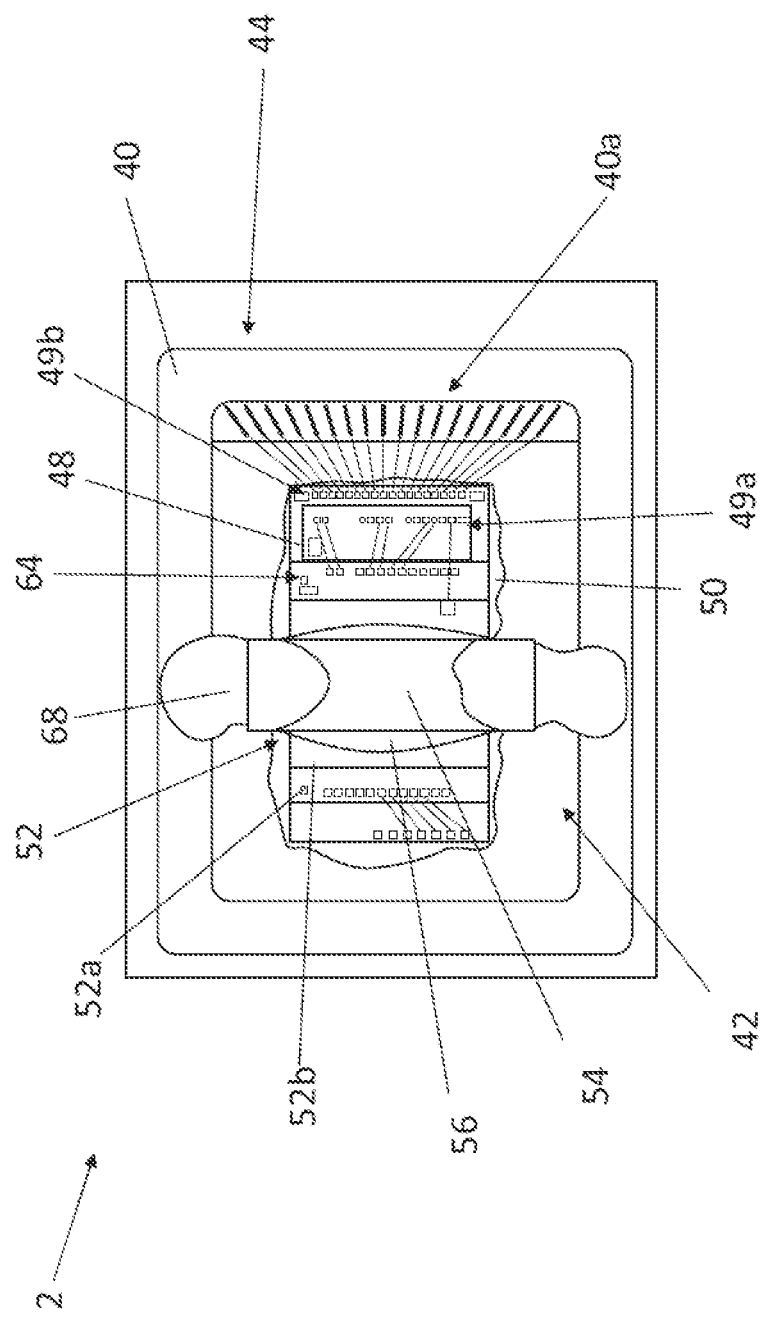
FIG. 6 is a top plan view of an integrated device package, with the lid hidden for ease of illustration, according to an embodiment.

FIG. 6 is a top plan view of the integrated device package 2 with the lid hidden for ease of illustration, according to an embodiment. Reference numerals used in conjunction with FIG. 6 may represent the same or generally similar components as those of FIGS. 3A to 5, unless otherwise noted. The integrated device package 2 can comprise a package housing 40 that includes a base 42 and a sidewall 44. The housing 40 can at least partially define a cavity 47. The integrated device package 2 can also comprise a carrier 48 that is disposed in the cavity 47 and mounted on the base 42 by way of an adhesive 50, an integrated device die 52 disposed in the cavity 47, and a support structure 54 attached to the integrated device die 52. The adhesive 50 may comprise a die attach material. The die attach material may comprise an epoxy or a silicone material in various embodiments. The support structure 54 can couple to the sidewall 44 of the package housing 40 by way of an adhesive 68. The adhesive 68 may comprise a die attach material. The die attach material may comprise an epoxy or a silicone material in various embodiments.

Figure 7:
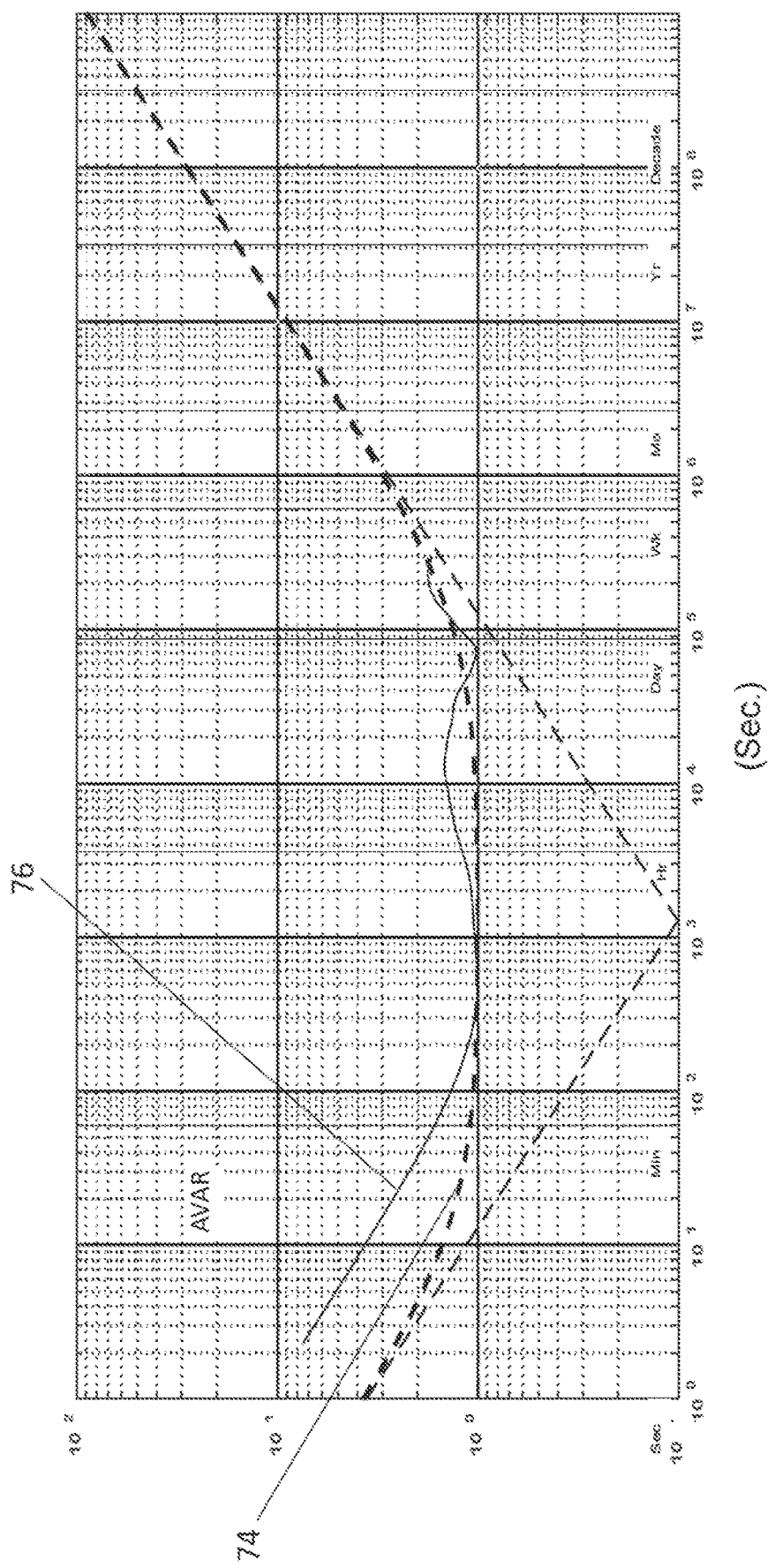
FIG. 7 is a graph showing a performance of an integrated device die of the integrated device package including the support structure over time.

FIG. 7 is a graph showing a performance of the integrated device die 52 of the package 2 over time. The x-axis shows time in seconds and the y-axis shows a sensor error in degree per second. A gap between an ideal curve 74 and measurement data 76 can be considered an error that may degrade the performance of the integrated device die 52. As compared to the performance of the integrated device die 22 shown in FIG. 2, the error in the measurement data 76 of the integrated device die 52 is reduced. The reduction in the error can be due to reduced stresses imparted to the integrated device die 52 by the support structure 54.

Figure 8:
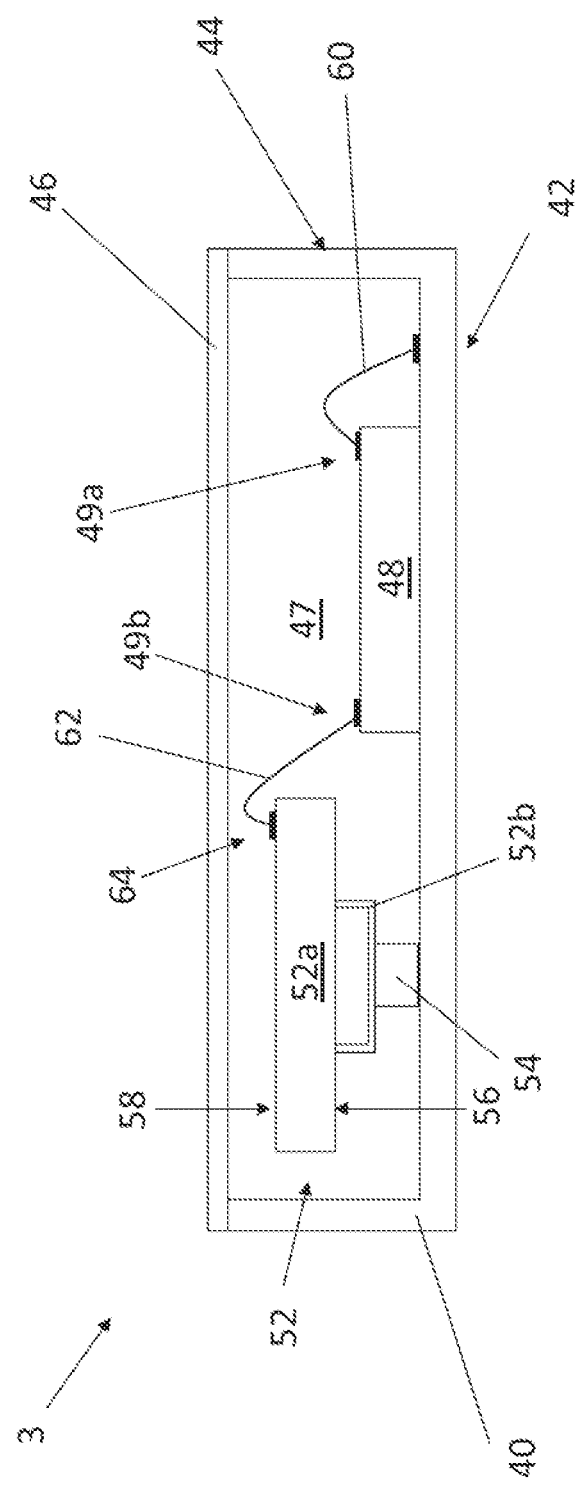
FIG. 8 is a schematic cross sectional side view of an integrated device package according to another embodiment.

FIG. 8 is a schematic cross sectional side view of an integrated device package 3 according to another embodiment. Reference numerals used in conjunction with FIG. 8 may represent the same or generally similar components as those of FIGS. 3A to 6, unless otherwise noted. The integrated device package 3 can comprise a package housing 40 that includes a base 42, a sidewall 44, and a lid 46. The housing 40 can define a cavity 47. The integrated device package 2 can also comprise a carrier 48 that is disposed in the cavity 47 and mounted on a portion of the base 42 by way of an adhesive 50, an integrated device die 52 disposed in the cavity 47, and a support structure 54 disposed between another portion of the base 42 and the integrated device die 52. Thus, in FIG. 8, the support structure 54 can attach to and support the die cap 52b in an inverted manner as compared to the embodiments of FIG. 3A-4, such that the support structure 54 can be disposed between a floor of the housing 40 and the die cap 52b. The support structure 54 can be oriented above the die cap 52b relative to gravitational forces or below the die cap 52b relative to gravitational forces.

In some embodiments, the support structure 54 allows an active portion (e.g., a device portion 52a) of the integrated device die 52 to be free from a die attach material and separated from other components of the package 3. In some embodiments, the support structure 54 allows most or entirety of the lower surface 58 of the integrated device die 52 to be only in contact with the gas (e.g., air) in the cavity 47. As such, the support structure 54 allows the device portion 52a of the integrated device die 52 to experience less stress as compared to a similar package that includes a die attach material on a surface of the device portion 52a of the integrated device die 52 the die and the carrier such as the package 1 illustrated in FIG. 1.

Figure 9A:
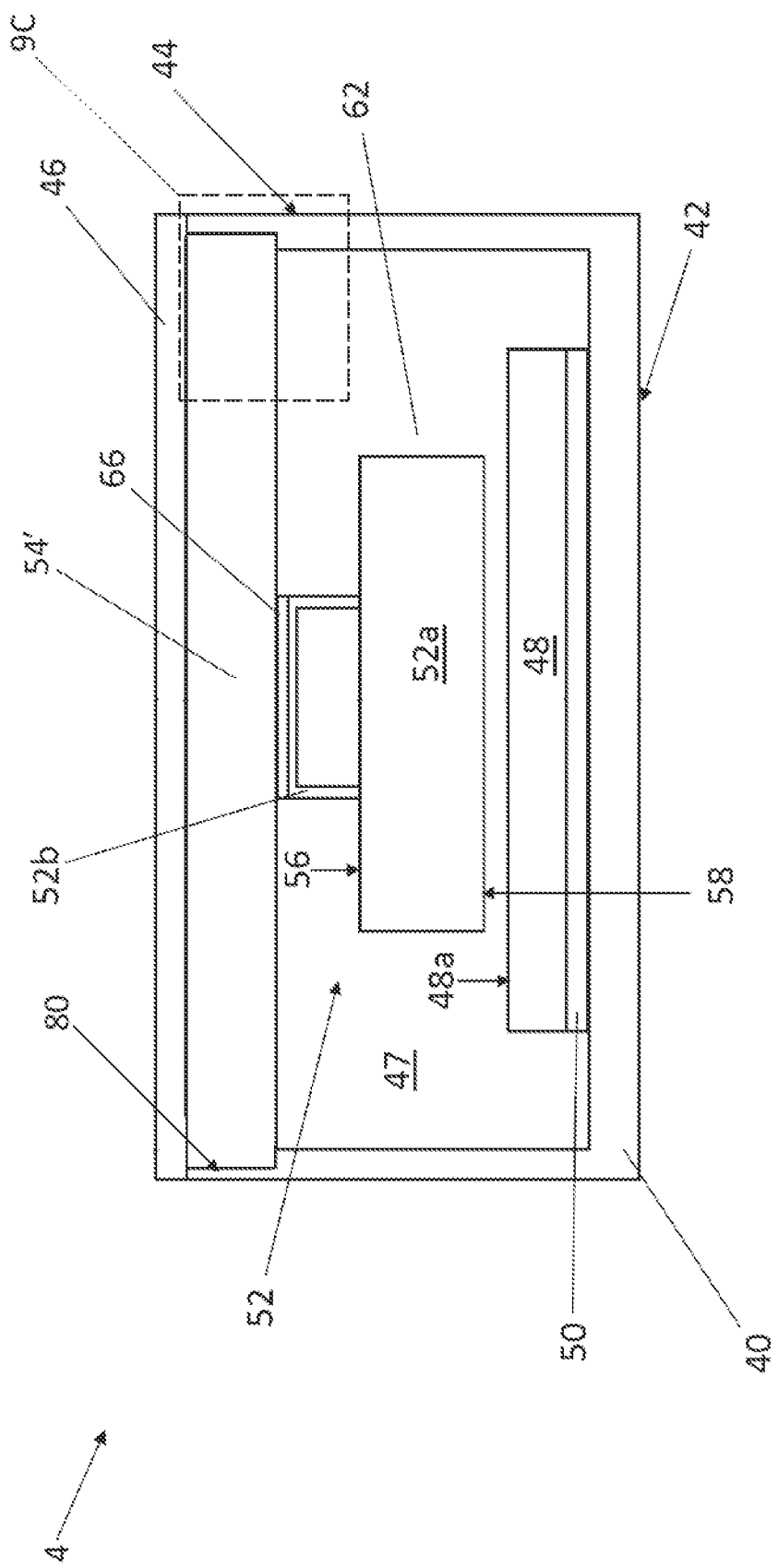
FIG. 9A is a schematic cross sectional side view of an integrated device package according to an embodiment.

FIG. 9A is a schematic cross sectional side view of an integrated device package 4 according to an embodiment. FIG. 9B is a schematic top plan view of the integrated device package 4. Reference numerals used in conjunction with FIGS. 9A and 9B may represent the same or generally similar components as those of FIGS. 3A-6, and 8 unless otherwise noted.

The integrated device package 4 can comprise a package housing 40' that includes a base 42, a sidewall 44 extending non-parallel from the base 42, a lid 46, and a slot 80. The package housing 40 can include terminals 43 on an outer surface of the base 42 to connect to an external device or substrate, such as a system board (not illustrated). The sidewall 44 can be coupled to (e.g., by an adhesive) or formed with (e.g., monolithically integrated with) the base 42. The housing 40 can define a cavity 47. The integrated device package 2 can also comprise a carrier 48 that is disposed in the cavity 47 and mounted on the base 42 by way of an adhesive 50, an integrated device die 52 disposed in the cavity 47, and a support structure 54' attached to the integrated device die 52. The adhesive 50 may comprise a die attach material. The die attach material may comprise an epoxy or a silicone material in various embodiments. The slot 80 can be configured to receive a portion of the support structure 54'. The support structure can have a length that is greater than a length between an inner side wall to an opposing inner side wall, and shorter than a length between an outer side wall to an opposing outer side wall. In some embodiments, the base 42 of the package housing 40 can comprise a molded leadframe substrate, which includes a conductive leadframe embedded in a molding material or molding compound. In other embodiments, the base 42 can comprise a laminate substrate (e.g., a printed circuit board or PCB), a ceramic substrate, or can comprise a pre-formed or molded housing integrally formed with the sidewall 44.

Figure 9C:
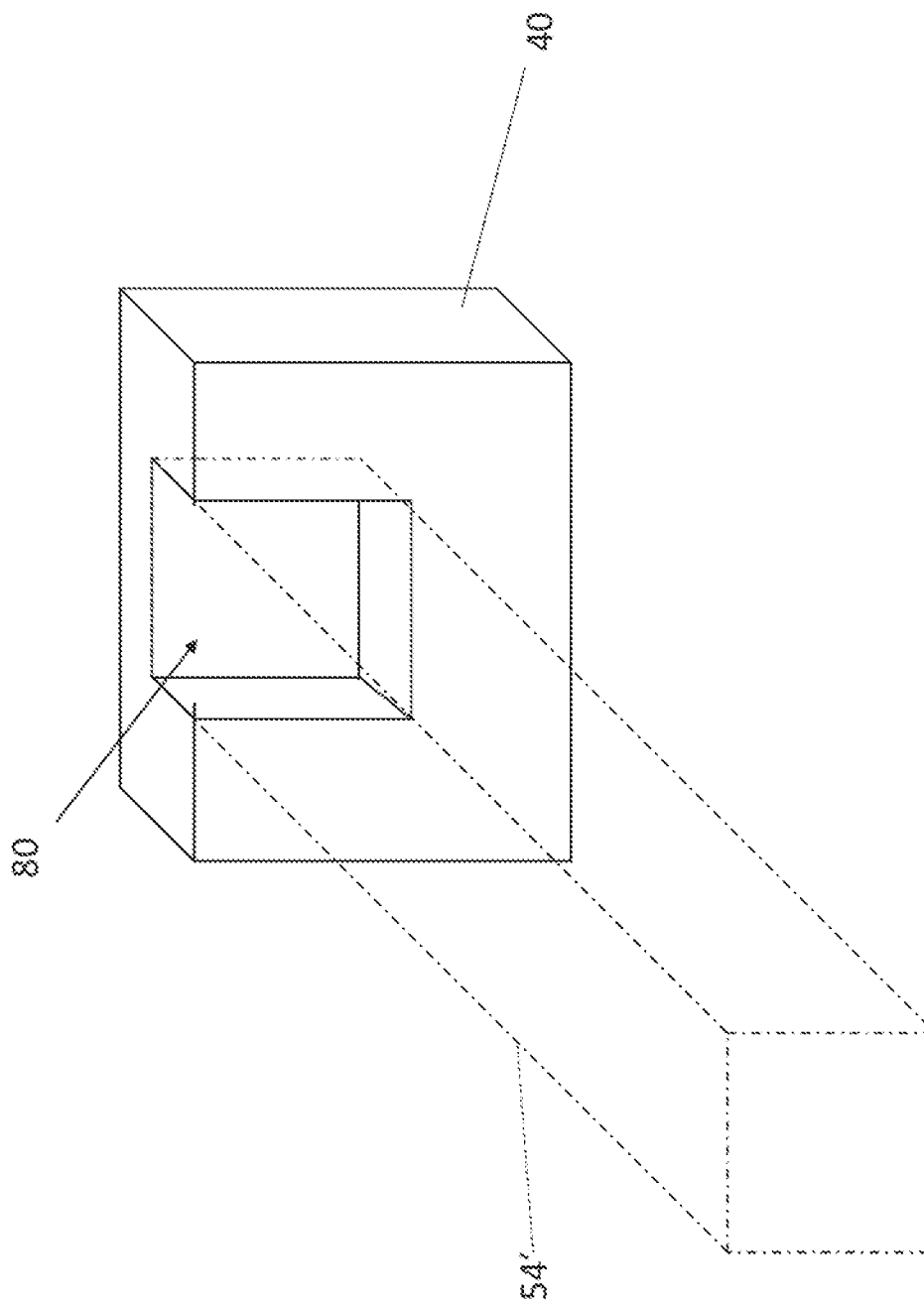
FIG. 9C is a schematic perspective view of a portion of the housing of FIGS. 9A and 9B.

FIG. 9C is a schematic perspective view of a portion of the housing 40' near the slot 80 indicated by dashed boxes in FIGS. 9A and 9B. In some embodiments, an adhesive (not illustrated) can be provided in the slot 80, between the slot 80 and the support structure 54'. In some embodiments, the support structure 54' can provide an improved ruggedness. In some embodiments, the integrated device die 52 can be coupled with the housing 40' more reliably with the support structure 54' as compared to a similar structure that does not include the slot for receiving a support structure.

Although disclosed in the context of certain embodiments and examples, it will be understood by those skilled in the art that the present invention extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. An integrated device package comprising:
 a package housing defining a cavity;
 an integrated device die disposed in the cavity, the integrated device die having a first surface comprising a sensitive component and a second surface opposite the first surface, the integrated device die comprising a die cap bonded to the first surface over the sensitive component;
 a carrier disposed in the cavity and electrically connected to the package housing, the carrier mounted to a portion of the package housing; and a support structure attached to the die cap, the support structure mechanically coupling the die cap and the package housing.

2. The integrated device package of claim 1, wherein the integrated device die comprises a microelectromechanical systems (MEMS) die, and the carrier is an application specific integrated device (ASIC) die.

3. The integrated device package of claim 1, wherein the package housing comprises a base, a sidewall extending from the base, and a lid attached to the sidewall.

4. The integrated device package of claim 3, wherein the support structure is bonded to the sidewall or the lid.

5. The integrated device package of claim 3, wherein the carrier comprises a second integrated device die mounted to the base, and the integrated device die is positioned between the second integrated device die and the lid.

6. The integrated device package of claim 5, further comprising a bonding wire electrically connecting and extending between the first surface of the integrated device die and the package housing or the second integrated device die.

7. The integrated device package of claim 1, wherein the support structure partially covers an upper surface of the die cap.

8. The integrated device package of claim 7, wherein the support structure covers 10% to 75% of the upper surface of the die cap.

9. The integrated device package of claim 7, wherein the support structure comprises a silicon bar.

10. The integrated device package of claim 1, wherein the cavity is a hermetic cavity filled with gas, and the second surface is free from a die attach material.

11. An integrated device package comprising:
a package housing defining a cavity, the package housing having a first region and a second region different from the first region;
a first integrated device die disposed in the cavity, the first integrated device die having a first surface facing the first region and a second surface facing away from the first region, the first surface including a sensitive component, the first integrated device die comprising a die cap bonded to the first surface over the sensitive component;
a second integrated device die disposed in the cavity and mounted to the second region of the package housing; and
a supporting structure disposed between an upper surface of the die cap and the first region of the package housing, wherein the supporting structure covers 10% to 75% of the upper surface of the die cap.

12. The integrated device package of claim 11, wherein the supporting structure mechanically connecting the first integrated device die and the package housing.

13. The integrated device package of claim 11, wherein the first surface of the first integrated device die comprises a conductive pad configured to connect to a bonding wire, and the second surface is free from a die attach material.

14. The integrated device package of claim 11, wherein the package housing comprises a base, a sidewall extending from the base, and a lid attached to the sidewall, the lid comprises the first region, and the base comprises the second region.

15. The integrated device package of claim 11, wherein the package housing comprises a base, a sidewall extending from the base, and a lid attached to the sidewall, and wherein a first portion of the base comprises the first region and a second portion of the base laterally offset from the first portion comprises the second region.

16. An integrated device package comprising:
an integrated device die having a first surface comprising a sensitive component, and a second surface opposite the first surface, the integrated device die comprising a die cap attached to the first surface and protecting the sensitive component; and
a support beam attached to the die cap, the support beam partially covering an upper surface of the die cap, and the support beam configured to couple the integrated device die to a package housing.

17. The integrated device package of claim 16, wherein the integrated device die comprises a microelectromechanical systems (MEMS) sensor die.

18. The integrated device package of claim 16, wherein the first surface of the integrated device die comprises a conductive pad configured to receive a bonding wire, and the second surface is free from a die attach material.

19. The integrated device package of claim 16, wherein the support beam covers 10% to 75% of the upper surface of the die cap.

20. The integrated device package of claim 16, wherein the support beam comprises a silicon bar.

* * * * *